United States Patent
Kim et al.

(10) Patent No.: US 8,179,778 B2
(45) Date of Patent: May 15, 2012

(54) METHOD AND SYSTEM FOR EFFECTIVE ADAPTIVE CODING AND MODULATION IN SATELLITE COMMUNICATION SYSTEM

(75) Inventors: Tae Hoon Kim, Seoul (KR); Pan Soo Kim, Daejeon (KR); Min Su Shin, Daejeon (KR); Dae Ig Chang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 392 days.

(21) Appl. No.: 12/516,258

(22) PCT Filed: Nov. 29, 2007

(86) PCT No.: PCT/KR2007/006082
§ 371 (c)(1),
(2), (4) Date: May 26, 2009

(87) PCT Pub. No.: WO2008/069492
PCT Pub. Date: Jun. 12, 2008

(65) Prior Publication Data
US 2010/0046415 A1 Feb. 25, 2010

(30) Foreign Application Priority Data
Dec. 6, 2006 (KR) .................. 10-2006-0122900
Oct. 10, 2007 (KR) .................. 10-2007-0101830

(51) Int. Cl.
*H04J 9/00* (2006.01)
*H04J 3/22* (2006.01)
(52) U.S. Cl. ............... 370/204; 370/503; 370/470
(58) Field of Classification Search ............ 370/315, 370/316, 470, 480, 484, 203, 204, 206, 503, 370/509, 485, 486
See application file for complete search history.

(56) References Cited

U.S. PATENT DOCUMENTS

| | | | |
|---|---|---|---|
| 6,777,615 B1 | 8/2004 | Gretz | |
| 7,315,582 B2 | 1/2008 | Chouly et al. | |
| 7,606,287 B2 * | 10/2009 | Mahany | ............ 375/130 |
| 7,609,747 B2 * | 10/2009 | Mahany | ............ 375/130 |

(Continued)

FOREIGN PATENT DOCUMENTS
EP 1 289 181 A1 3/2003
(Continued)

OTHER PUBLICATIONS

ETSI 2004, "Digital Video Broadcasting (DVB); Second generation framing structure, channel coding and modulation systems for Broadcasting, Interactive Services, News Gathering and other broadband satellite applications", 74 pages.
International Search Report for PCT/KR2007/006082, mailed Jan. 30, 2008.

*Primary Examiner* — Brian Nguyen
(74) *Attorney, Agent, or Firm* — Staas & Halsey LLP

(57) ABSTRACT

A Second Generation Digital Video Broadcasting via Satellite (DVB-S2) system is provided. More particularly, a method and apparatus for maintaining synchronization of a signal by changing an Adaptive Coding and Modulation (ACM) method that is used for a conventional DVB-S2 system are provided. In the apparatus and method, an FEC frame of a variable length is formed by turbo encoding rather than Bose-Chaudhuri-Hocquenghem (BCH) and Low Density Parity Check (LDPC) encoding, and a Physical Layer (PL) frame of a specific length is formed regardless of a modulation method, so that a satellite terminal receives a signal transmitted at a specific length regardless of a modulation method or a coding rate to easily maintain synchronization without interruption and efficiently transmit the signal.

8 Claims, 4 Drawing Sheets

U.S. PATENT DOCUMENTS

| | | | |
|---|---|---|---|
| 7,675,842 B2 * | 3/2010 | Thesling | 370/205 |
| 7,684,425 B2 * | 3/2010 | Thesling | 370/415 |
| 2003/0212948 A1 | 11/2003 | Eroz et al. | |
| 2003/0231706 A1 | 12/2003 | Hwang | |
| 2006/0205358 A1 * | 9/2006 | Itoh et al. | 455/69 |
| 2008/0019394 A1 * | 1/2008 | Rengarajan et al. | 370/468 |

FOREIGN PATENT DOCUMENTS

| | | |
|---|---|---|
| EP | 1 408 637 A1 | 4/2004 |
| KR | 10-0299132 | 6/2001 |
| KR | 10-2002-0050299 | 6/2002 |
| WO | 03/094520 A1 | 11/2003 |

* cited by examiner

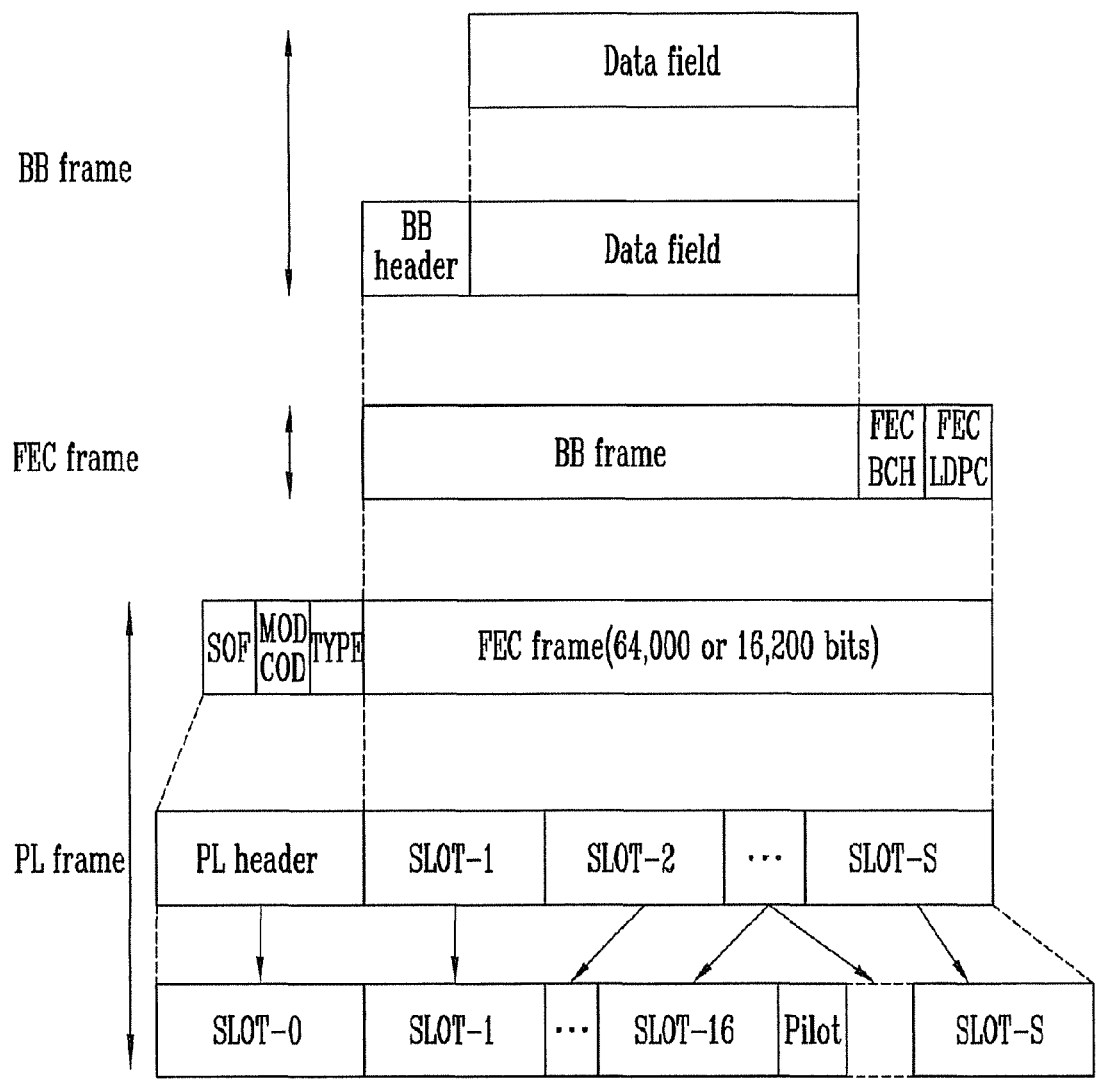
[Fig. 1]

[Fig. 2]
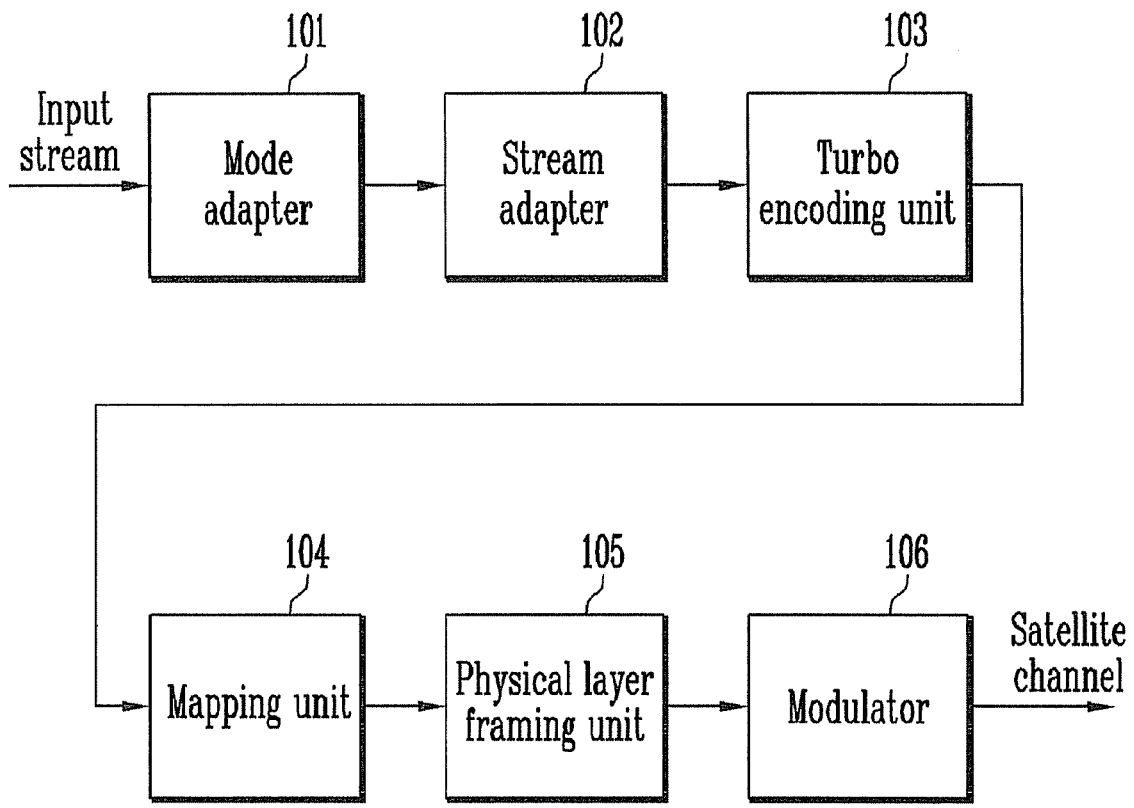

[Fig. 3]
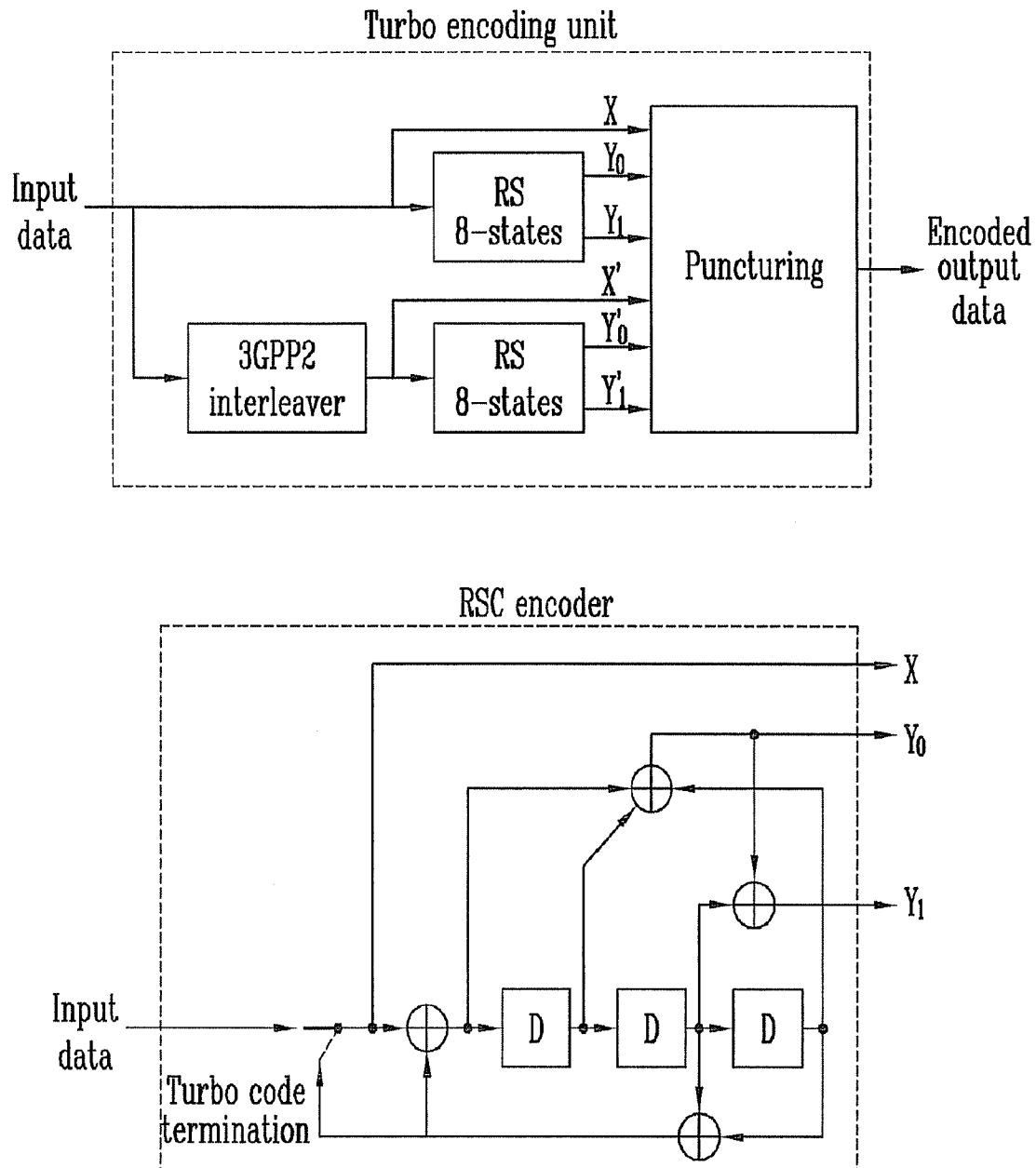

[Fig. 4]
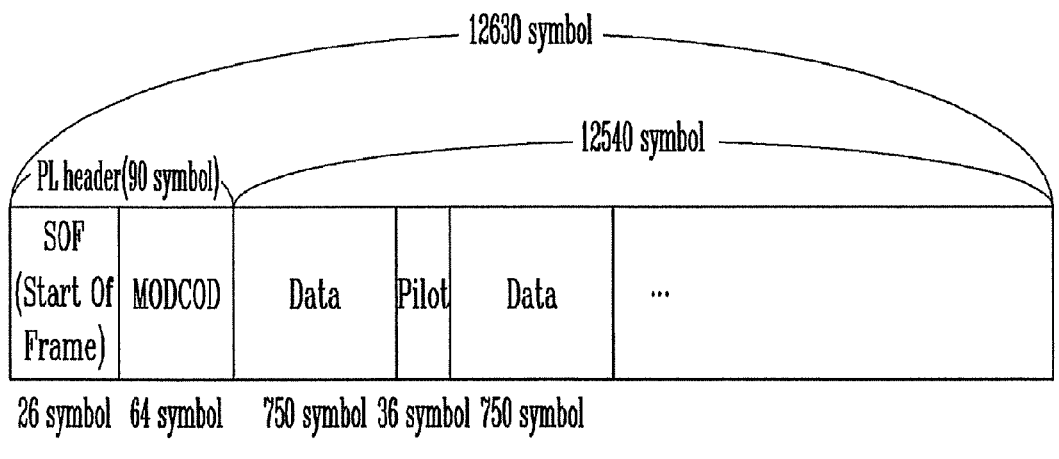
[Fig. 5]
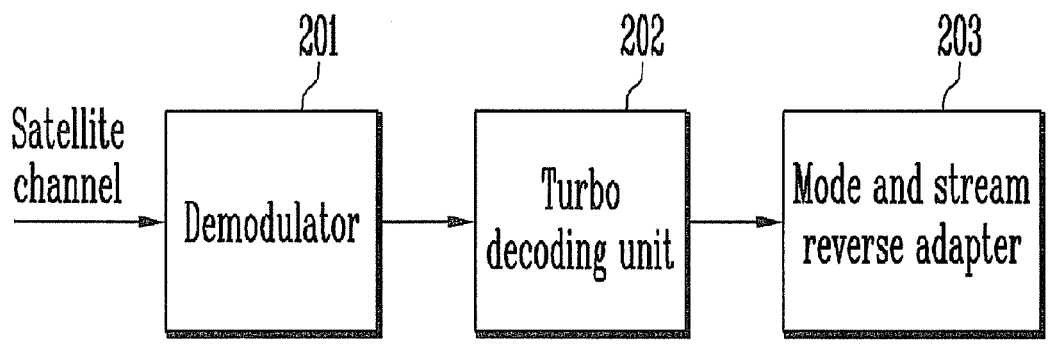

METHOD AND SYSTEM FOR EFFECTIVE ADAPTIVE CODING AND MODULATION IN SATELLITE COMMUNICATION SYSTEM

CROSS REFERENCE TO RELATED APPLICATIONS

This application claims the benefit under 35 U.S.C. Section 371, of PCT International Application Number PCT/KR2007/006082, filed Nov. 29, 2007 and Korean Application Nos. 10-2006-0122900 filed Dec. 6, 2006 and 10-2007-0101830 filed Oct. 10, 2007, the contents of all of which are incorporated herein by reference.

TECHNICAL FIELD

The present invention relates to a Second Generation Digital Video Broadcasting via Satellite (DVB-S2) system, and more particularly, to a method and system for maintaining synchronization of a signal by changing an Adaptive Coding and Modulation (ACM) method that is used for a conventional DVB-S2 system.

The present invention is derived from a project entitled "Development of Broadband Adaptive Satellite Communications and Broadcasting Convergence Technology [2005-S-013-02]" conducted as an IT R&D program for the Ministry of Information and Communication (Republic of Korea.)

BACKGROUND ART

To meet demand for obtaining a higher transmission capacity than a conventional satellite broadcasting system, DVB-S1, an increase in service availability through improved link margin, implementation of new services of broadband broadcasting such as HDTV, and appearance of a Ka-band satellite system, a DVB-S2 system, in which the DVB-S1 system is improved, is being developed. The DVB-S2 system applies an Adaptive Coding and Modulation (ACM) method to cope with effects caused by rain attenuation in a Ka band. In the ACM method, a transmitter changes adaptively coding/modulation methods and transmits Modulation Coding (MODCOD) information that is on the coding and modulation methods together with data according to data reception performance of a receiver, and the receiver changes decoding/demodulation methods of the received signal according to the MODCOD information.

A frame structure of the DVB-S2 system includes a BB frame that is an output of a stream adapter, a Forward Error Correction (FEC) frame that is an output of an FEC encoder and a PL frame that is an output of a physical layer (PL) framing unit. The BB frame largely includes a Base-Band (BB) header and a data field. In the FEC encoder, outer encoding of Bose-Chaudhuri-Hocquenghem (BCH) codes and internal encoding of Low Density Parity Check (LDPC) codes are performed, so that each parity is added to the BB frame to constitute the FEC frame. The PL frame divides the FEC frame block into slots of 90 symbols to transmit the classified results as a frame process for actual transmission through modulation. Start of Frame (SOF) that is information on startpoints of each frame, signaling information of MODCOD informing a transmission method and a pilot signal are inserted to constitute the PL frame. FIG. 1 schematically illustrates the configuration of a conventional DVB-S2 frame.

According to the conventional DVB-S2 system, the FEC frame formed by the BCH and LDPC encoding has a specific length (for example, 64,800 bits or 16,200 bits) regardless of a coding rate and a modulation method, and the length of the PL frame is variable depending on the modulation method.

As described above, according to the conventional DVB-S2 system, the length of the PL frame is changed depending on the modulation method and the coding rate, and it is difficult for a receiver to maintain initial frame synchronization to cope with the change.

DISCLOSURE OF INVENTION

Technical Problem

The present invention is directed to an apparatus and method, in which a Forward Error Correction (FEC) frame of a variable length is formed by turbo encoding rather than Bose-Chaudhuri-Hocquenghem (BCH) and Low Density Parity Check (LDPC) encoding, and a PL frame of a specific length is formed regardless of a modulation method, so that a satellite terminal receives a signal transmitted in a specific length regardless of a modulation method or a coding rate to maintain synchronization without interruption and efficiently transmit the signal.

Technical Solution

One aspect of the present invention provides a system for adaptive coding and modulation for effectively receiving and transmitting a signal in a DVB-S2 system comprising: a mode adapter receiving an input stream to perform synchronization of the input stream, null-packet deletion and Cyclic Redundancy Check (CRC)-8 encoding for error detection; a stream adapter performing padding and Base-Band (BB) scrambling to constitute a BB frame; a turbo encoding unit applying turbo encoding to the BB frame to constitute a Forward Error Correction (FEC) frame; a mapping unit determining bit mapping according to status of a transmission channel; a physical layer framing unit inserting a physical layer (PL) header and a pilot symbol into the FEC frame to constitute a PL frame; and a modulator performing modulation on the PL frame to transmit the PL frame.

Another aspect of the present invention provides a method of adaptive coding and modulation for effectively receiving and transmitting a signal in a DVB-S2 system comprising the steps of: receiving an input stream to perform synchronization of the input stream, null-packet deletion and Cyclic Redundancy Check (CRC)-8 encoding for error detection; performing padding and BB scrambling to constitute a BB frame; applying turbo encoding to the BB frame to constitute an FEC frame; determining bit mapping according to status of a transmission channel; inserting a PL header and a pilot symbol into the FEC frame to constitute a PL frame; and performing modulation on the PL frame to transmit the PL frame.

Advantageous Effects

In the present invention, an FEC frame of a variable length is formed by turbo encoding rather than Bose-Chaudhuri-Hocquenghem (BCH) and Low Density Parity Check (LDPC) encoding, and a Physical Layer (PL) frame of a specific length is formed regardless of a modulation method, so that a satellite terminal receives a signal transmitted in a specific length regardless of a modulation method or a coding rate to maintain synchronization without interruption and efficiently transmit the signal.

BRIEF DESCRIPTION OF THE DRAWINGS

FIG. 1 schematically illustrates the configuration of a conventional Second Generation Digital Video Broadcasting via Satellite (DVB-S2) frame;

FIG. 2 is a block diagram schematically illustrating the configuration of a transmitter of a DVB-S2 system according to an exemplary embodiment of the present invention;

FIG. 3 illustrates a turbo encoding unit constituting an FEC frame according to an exemplary embodiment of the present invention;

FIG. 4 illustrates the configuration of a Physical Layer (PL) frame according to an exemplary embodiment of the present invention; and FIG. 5 is a block diagram schematically illustrating the configuration of a receiver of the DVB-S2 system according to an exemplary embodiment of the present invention.

MODE FOR THE INVENTION

Hereinafter, exemplary embodiments of the present invention will be described in detail. However, the present invention is not limited to the exemplary embodiments disclosed below, but can be implemented in various types. Therefore, the present exemplary embodiments are provided for complete disclosure of the present invention and to fully inform the scope of the present invention to those ordinarily skilled in the art.

A method and apparatus for adaptive coding and modulation for efficiently receiving and transmitting a signal in a satellite communication system according to the present invention will be described in detail below.

FIG. 2 is a block diagram schematically illustrating the configuration of a transmitter of a Second Generation Digital Video Broadcasting via Satellite (DVB-S2) system according to an exemplary embodiment of the present invention. A mode adapter 101 performs input stream interface and Cyclic Redundancy Check (CRC)-8 encoding for synchronization of the input stream, null-packet deletion for an ACM mode and a TS input format and error detection, and mixing the input stream for multi-input streams. A Base-Band (BB) header is added to a front end of a data field to inform the receiver of an input stream format and a mode adaptive type as a format of a frame. A stream adapter 102 performs padding and BB scrambling to form a BB frame. In Forward Error Correction (FEC) encoding of a conventional DVB-S2 system, errors are corrected by a Bose-Chaudhuri-Hocquenghem (BCH) code as an outer code and a Low Density Parity Check (LDPC) code of various coding rates as an internal code, and the length of an FEC code block is constantly set to 64,800 bits or 16,200 bits according to an application. However, in the present invention, an FEC frame is formed using a turbo encoding unit 103, and the turbo encoding will be described in detail below. In a mapping unit 104, mapping is performed by Binary Phase-Shift Keying (BPSK), Quadrature Phase Shift Keying (QPSK), 8Phase Shift Keying (QPSK), 16 Amplitude Phase Shift Keying (APSK) and 32 Amplitude Phase Shift Keying (APSK) constellations, and bit mapping is determined according to an applied region or status of a transmission channel. In case of constellations of BPSK, QPSK and 8PSK, Gray mapping is applied to attain a low bit error rate. In a Physical Layer (PL) framing unit 105, synchronization with an FEC frame that is a block code is performed, and a dummy frame is inserted depending on the circumstances to maintain a symbol rate, synchronization of a frame is performed and a PL header that is information on the modulation/the coding rate and a pilot symbol for carrier recovery for a receiver are inserted to constitute the PL frame, and PL scrambling is performed for energy distribution. In a modulator 106, a filtering function is performed on baseband data by a Square Root Raised Cosine (SRC) shaping filter having a roll-off factor of 0.35, 0.25 or 0.20, and the data is modulated to an Intermediate Frequency (IF) signal of 700 MHz or 140 MHZ by quadrature modulation.

FIG. 3 illustrates a turbo encoding unit constituting an FEC frame according to an exemplary embodiment of the present invention. The turbo encoding unit receives an input data bit stream, and the input data is immediately classified into data X input into a puncturing block, data input into a Recursive Systematic Convolutional (RSC) 8-State block, and data input into a 3rd Generation Partnership Project 2 (3GPP2) interleaver. A detailed configuration of the RSC 8-State is illustrated in FIG. 3, and three values X, $Y_0$ and $Y_1$ are generated from the data input into the RSC 8-State block. As described above, the data passing through the 3GPP2 interleaver is input into the RSC 8-State block to generate three values X', $Y'_0$ and $Y'_1$. 6-bit data in total is input into the puncturing block, and is classified into data to be transmitted and not to be transmitted in the puncturing block depending on a coding rate. Puncturing of the input data X and X' is not performed, and coded output data is determined by a coding rate. Symbol mapping of the output data bit is performed by a symbol mapping process, e.g., a bit rate for the QPSK is 2 bits and for 8PSK is 3 bits.

FIG. 4 illustrates the configuration of a PL frame according to an exemplary embodiment of the present invention. Start of Frame (SOF) is used as externally pre-determined stored data, and MODCOD includes a pre-determined modulation method and information on whether there is a pilot or not. The frame includes symbol-mapped data, and a pilot is inserted therebetween. As illustrated, the PL frame according to the present invention has a specific length regardless of a modulation method.

FIG. 5 is a block diagram schematically illustrating the configuration of a receiver of a DVB-S2 system according to an exemplary embodiment of the present invention. In a demodulator 201, the frequency phase of a symbol clock and a carrier are recovered from a baseband signal, and time synchronization with the carrier is maintained using a pilot signal regardless of a change in a demodulation method over time. Also, a SOF symbol is detected from the frame, PL de-scrambling is performed, and de-mapping of the BB frame and PL header is performed in the demodulator. A turbo decoding unit 202 performs decoding using a turbo decoder. A mode and stream reverse adapter 203 includes a stream adapter performing BB frame de-scrambling and padding bit deletion, a buffer performing packet delineation and storing a Moving Picture Experts Group (MPEG) Transport Stream (TS) packet, and a mode adapter performing MPEG TS scheduling and Cyclic Redundancy Check (CRC) decoding.

While the invention has been shown and described with reference to certain exemplary embodiments thereof, it will be understood by those skilled in the art that various changes in form and details may be made therein without departing from the spirit and scope of the invention as defined by the appended claims.

The invention claimed is:

1. A system for adaptive coding and modulation, comprising:
a mode adapter receiving an input stream to perform synchronizing the input stream, deleting null-packet, and encoding for error detection;
a stream adapter performing padding and Base-Band (BB) scrambling to constitute a BB frame;

a turbo encoding unit applying turbo encoding to the BB frame to constitute a Forward Error Correction (FEC) frame;

a mapping unit determining bit mapping according to the status of a transmission channel;

a physical layer framing unit inserting a physical layer (PL) header and a pilot symbol into the FEC frame to constitute a PL frame; and a modulator performing modulation on the PL frame to transmit the PL frame.

2. The system of claim 1, wherein the FEC frame has a frame length that is variable depending on a modulation method.

3. The system of claim 1, wherein the PL frame has a specific length regardless of a modulation method or a coding rate.

4. The system of claim 1, further comprising:

a demodulator maintaining frame and frequency synchronization of a signal received from the modulator; and a turbo decoding unit applying turbo decoding to a demodulated signal.

5. A method for adaptive coding and modulation, comprising:

receiving, by a mode adapter, an input stream to perform synchronizing the input stream, deleting null-packet, and encoding for error detection;

performing, by a stream adapter, padding and Base-Band (BB) scrambling to constitute a BB frame; applying turbo encoding, by a turbo encoding unit, to the BB frame to constitute an Forward Error Correction (FEC) frame;

determining, by a mapping unit, bit mapping according to the status of a transmission channel;

inserting, by a physical layer framing unit, a Physical Layer (PL) header and a pilot symbol into the FEC frame to constitute a PL frame; and performing, by a modulator, modulation on the PL frame to transmit the PL frame.

6. The method of claim 5, wherein the FEC frame has a frame length that is variable depending on a modulation method.

7. The method of claim 5, wherein the PL frame has a specific length regardless of a modulation method or a coding rate.

8. The method of claim 5, further comprising: maintaining, by a demodulator, frame and frequency synchronization of a received signal; and applying turbo decoding, by a turbo decoding unit, to a demodulated signal.

* * * * *